United States Patent [19]

Guillou et al.

[11] Patent Number: 4,866,369

[45] Date of Patent: Sep. 12, 1989

[54] WAVEGUIDE STRUCTURE FOR ESTIMATING THE ELECTROMAGNETIC CHARACTERISTICS OF A DIELECTRIC OR MAGNETIC MATERIAL

[75] Inventors: Bernard P. Y. Guillou, Aubin du Medoc; Pierre V. A. Lahitte, Salaunes, both of France

[73] Assignee: Aerospatiale Societe Nationale Industrielle, Paris, France

[21] Appl. No.: 225,783

[22] Filed: Jul. 29, 1988

[30] Foreign Application Priority Data

Aug. 3, 1987 [FR] France ................. 87 11009

[51] Int. Cl.[4] .......................... G01R 27/04
[52] U.S. Cl. .................. 324/58 B; 324/58.5 B
[58] Field of Search ............. 324/58 R, 58 A, 58 B, 324/58.5 R, 58.5 A, 58.5 B; 333/244, 22 R, 245

[56] References Cited

U.S. PATENT DOCUMENTS

| | | | |
|---|---|---|---|
| 2,774,944 | 12/1956 | Lintzel | 333/244 |
| 3,268,808 | 8/1966 | Weinschel | 324/58 |
| 3,693,080 | 9/1972 | Ross et al. | 324/58.5 A |
| 4,246,534 | 1/1981 | Jacobi et al. | 324/57 R |
| 4,507,602 | 3/1985 | Aguirre | 324/58 R |

OTHER PUBLICATIONS

Kwok et al., "Time-Domain Measurements . . . ;" IEEE Trans. Inst. and Measurement, vol. IM-28 (Jun. 1979), pp. 109-112.

Franceschetti, "A Complete Analysis of . . . ," Alta Freqeunza, Milan; vol. 36, No. 8 (Aug. 1967), pp. 757-764.

Steel et al., "A Precision Method for . . . ," J. Phys. E. Sci. Instrum., vol. 17, No. 1 (Jan. 1984), pp. 30-34.

Primary Examiner—Reinhard J. Eisenzopf
Assistant Examiner—Anthony L. Miele
Attorney, Agent, or Firm—Fisher, Christen & Sabol

[57] ABSTRACT

A device is provided for estimating the electromagnetic characteristics of a dielectric or magnetic material by means of a hyperfrequency electromagnetic wave which device comprises a coaxial line formed of a tubular body (2,3) and a core (1), which are rigid and coaxial with, at one end, a housing such that the external and internal peripheries of an annular sample piece (17) are respectively in tight friction contact with the inner surface of said tubular body and with the external surface of said core, said tubular body being formed of two parts which can be assembled together.

10 Claims, 4 Drawing Sheets

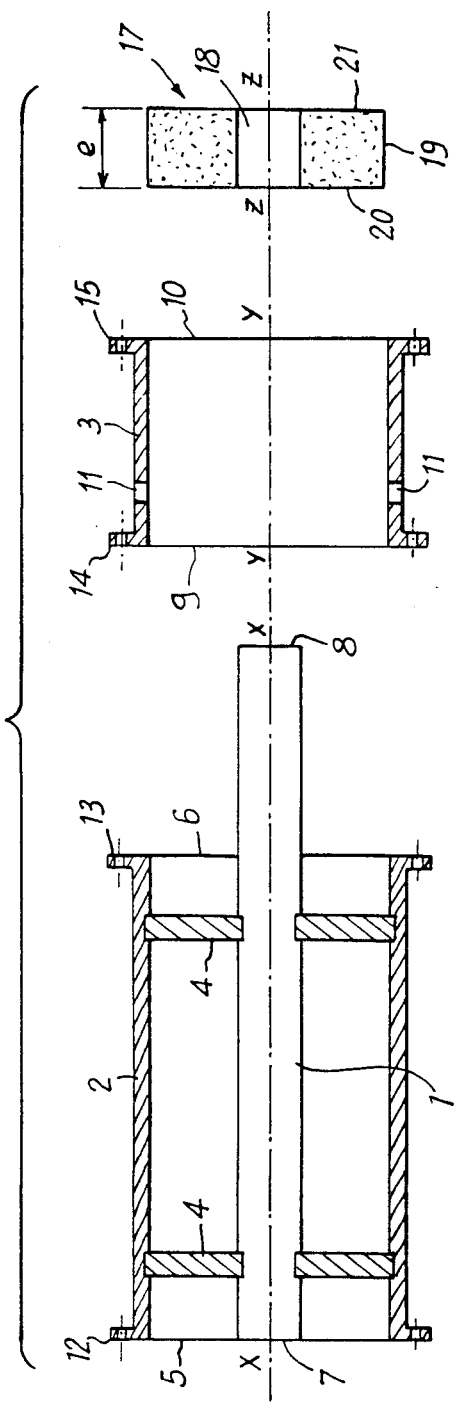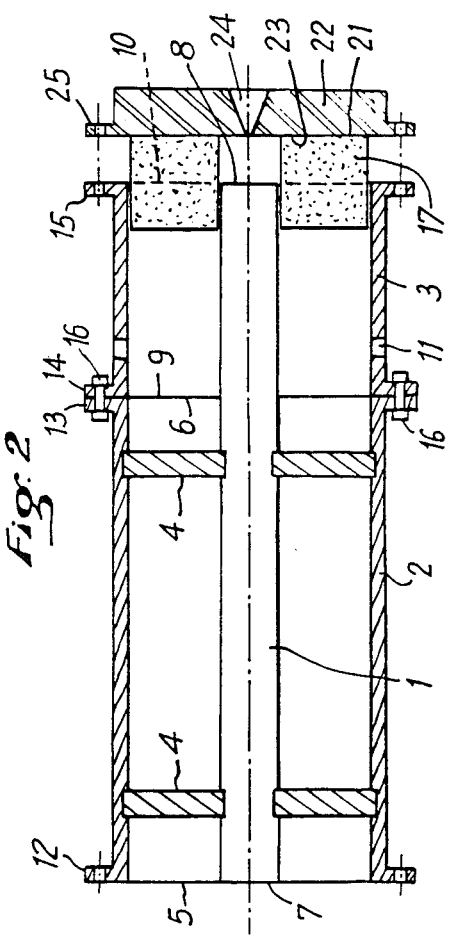
Fig. 1
Fig. 2

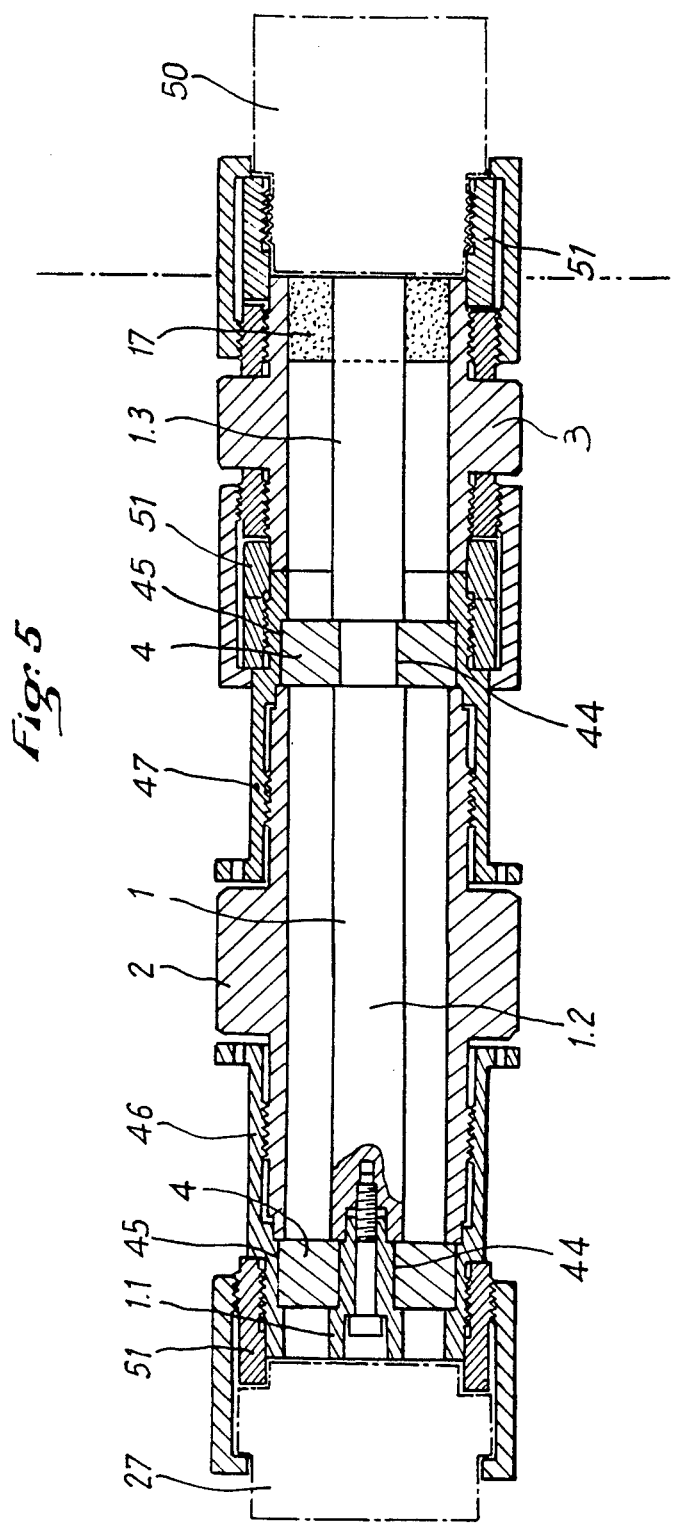

WAVEGUIDE STRUCTURE FOR ESTIMATING THE ELECTROMAGNETIC CHARACTERISTICS OF A DIELECTRIC OR MAGNETIC MATERIAL

The present invention relates to a device for estimating the electromagnetic characteristics of a dielectric or magnetic material.

In order to characterize the electromagnetic behavior of materials, it is necessary to know their relative permittivity and permeability. Furthermore, each of these electromagnetic characteristics (relative permittivity and permeability) comprises a real term and an imaginary term.

Methods are already known, for example from the article "A complete analysis of the reflection and transmission methods for measuring the complex permeability and permittivity of materials at microwaves" published in ALTA FREQUENZA, vol 36, n° 8, August 1967, pages 757–764, MIlan, IT, G FRANCESCHETTI or else from the article "Time-domain measurements for determination of dielectric properties of agricultural materials" published in IEEE TRANSACTION ON INSTRUMENTATION AND MEASUREMENT, vol IM-28, n° 2 June 1979, pages 109–112, IEEE, New York, U.S., B.P KWOW et al, either for directly measuring the reflection and/or transmission coefficients of dielectric samples, or for measuring the real and imaginary terms of the relative permittivity and permeability of a material.

These methods are based on the fact that, if a dielectric or magnetic material receives an incident electromagnetic wave, it transmits and reflects this wave while attenuating it and phase-shifting it, the attenuation and the phase-shift undergone by the transmitted wave being functions of the permeability and the permittivity of said material and of the limit conditions imposed on the wall of the material.

To put such methods into practice, U.S. Pat. No. 3,693,080 describes a device for estimating the electromagnetic characteristics of a dielectric or magnetic material, comprising :

a rigid core made from an electrically conducting material, a rigid tubular body, also made from an electrically conducting material, coaxially surrounding said conducting core so that said core and said tubular body are able to form a rigid coaxial line;

means for applying an incident hyperfrequency electromagnetic wave between said core and said body;

a housing for an annular piece of uniform thickness formed from said material, this annular piece being such that, when it is disposed in said housing, its external and internal peripheries are respectively in tight friction contact with the inner surface of said tubular body and with the outer surface of said core;

means for collecting the electromagnetic wave transmitted by said annular piece.

Thus, in order to use this known device :

an annular piece of uniform thickness is formed in said material;

said annular piece is introduced in said coaxial line;

an incident hyperfrequency electromagnetic wave is applied to said coaxial line;

the amplitudes and/or the phases of the transmitted wave and of the reflected wave are examined by said tubular body.

In this known device, in order to form a mathematical model of the measurement, a wave reflector element is provided in the coaxial line disposed downstream of said annular piece and the transmitted wave is collected from the side of said coaxial line to which the incident wave is applied. This wave reflector element is an electromagnetic element which forms a short circuit between the tubular body and the core of the coaxial line.

In the device of U.S. Pat. No. 3,693,080, the housing for the annular piece of material to be studied is provided in an intermediate position in said coaxial line so that it is necessary to provide a removable cap in said rigid tubular body. In addition, it is also necessary for said annular piece to be fixed to a conducting core section which must be provided with means for fixing to the upstream and downstream portions of said core, so as to ensure the electric continuity thereof.

Consequently, not only the sample of the material to be studied is complex to form, since besides said annular piece it must comprise a core section, but it must further have a removable cap in the rigid tubular body. The result is then a complex structure. Furthermore, in particular because of the manufacturing tolerances of said cap of said sample, it is practically impossible for said annular piece to be able to occupy a fixed reference position and for the relative positions of the tubular body and of the core to be invariable, during a series of measurement. This lack of positioning precision leads to measurement errors whose importance makes the measurements themselves illusory.

An object of the present invention is to overcome these drawbacks.

For this, in accordance with the present invention, the device for estimating the electromagnetic characteristics of a material, comprising :

a rigid core made from an electrically conducting material;

a rigid tubular body, also made from an electrically conducting material, surrounding said conducting core coaxially, so that said core and said tubular body are able to form a rigid coaxial line;

means for applying an incident hyperfrequency electromagnetic wave between said core and said body;

a housing for an annular piece of uniform thickness formed from said material, this annular piece being such that, when it is disposed in said housing, its external and internal peripheries are respectively in tight friction contact with the inner surface of said tubular body and with the outer surface of said core, and means for collecting the electromagnetic wave transmitted by said annular piece, is remarkable :

in that said housing is provided at one end of said coaxial line;

and in that said tubular body is made from two parts which can be assembled together.

Thus, said sample may be formed only of said annular piece, which may be readily introduced through the open end of said line and there occupy a fixed position.

Furthermore, because of the possibility of separating the tubular body into two parts, it is easy to remove said sample, for example so as to replace it by another. Furthermore, with this design, the respective positions of the core and of the tubular body remain invariable.

It will be noted that the article in the review IEEE TRANSACTIONS ON INSTRUMENTATION AND MEASUREMENT mentioned above, already provides for disposing the sample at the end of the line.

But then it is necessary to provide a removable portion of the central core, which raises electric coupling difficulties and does not allow ready removal of the sample.

As will be explained hereafter, the reference position of the sample in the device of the present invention may be defined by cooperation of the wave reflector element with said coaxial line. Such an element may be a simple short circuit, but it may also be provided for introducing a calibrated or known load between said tubular body and said core. Such a reflector element may be disposed directly downstream of said annular piece, i.e. in contact therewith, or else at some distance from said annular piece, downstream thereof.

Generally, the purpose of such a reflector element is to place the coaxial line in a given and reproducible electromagnetic condition.

Preferably, a plurality of such different reflector elements are provided so as to be able to communicate to said coaxial line a plurality of given electromagnetic conditions which makes possible the calculation of corrector coefficients.

Use of the device of the present invention may make it possible to determine, by comparison, if a material to be examined has electromagnetic characteristics different from those of a reference material.

However, it is preferably used for measuring the relative permittivity and permeability of a dielectric or magnetic material.

It will be noted that such a measurement requires four unknowns to be determined, namely the real and imaginary terms of the permittivity and of the permeability. It is therefore necessary to make at least two phase and modulus measurements. Such measurements may be made in different ways. For example, several pieces of different thicknesses of the same material may be examined, the examination being carried out by only studying the reflection coefficients (in phase and in amplitude).

However, only a single annular piece of the material to be examined may be used and the reflection and transmission coefficients measured at the same time. In this case as many relationships are established as it is necessary for calculating the real and imaginary parts of the permittivity and of the permeability of the material forming the annular piece.

It is clear form the foregoing that said means for collecting the transmitted wave may be disposed on the side of said coaxial line opposite the means for applying the incident wave. They may also be disposed on the same side of said coaxial line as the means for applying the incident wave.

In a way known per se, in order to overcome the measurement errors which might be due to variations in the relative arrangements of the core and of the tubular body, the latter are securely fixed to each other by means of internal annular spacers. For the ease of manufacture, one of said spacers is preferably located in the vicinity of the connection between said assemblable parts of said tubular body. For the same purpose of ease of manufacture, at least one other spacer of the coaxial line is disposed in the vicinity of one end thereof. Preferably, each spacer is housed, at its internal and external peripheries, in facing grooves, formed respectively in said core and in said tubular body.

Each of these grooves is then defined between a face of said tubular body and an end piece able to be assembled with said body and said core is made from several interfitting parts.

Thus it can be seen that, with the present invention, a rigid measuring device is obtained in which the annular dielectric or magnetic material piece is positioned accurately and is subjected to balanced pressures on both its faces.

The figures in the accompanying drawing will clearly shown how the invention may be implemented. In these figures, identical references designate identical elements.

FIG. 1 is a schematic exploded view in section of a device of the invention,

FIG. 2 shows the device of FIG. 1 during assembly,

FIG. 5 shows, in axial section, one embodiment of the device of the present invention.

Figure 3:
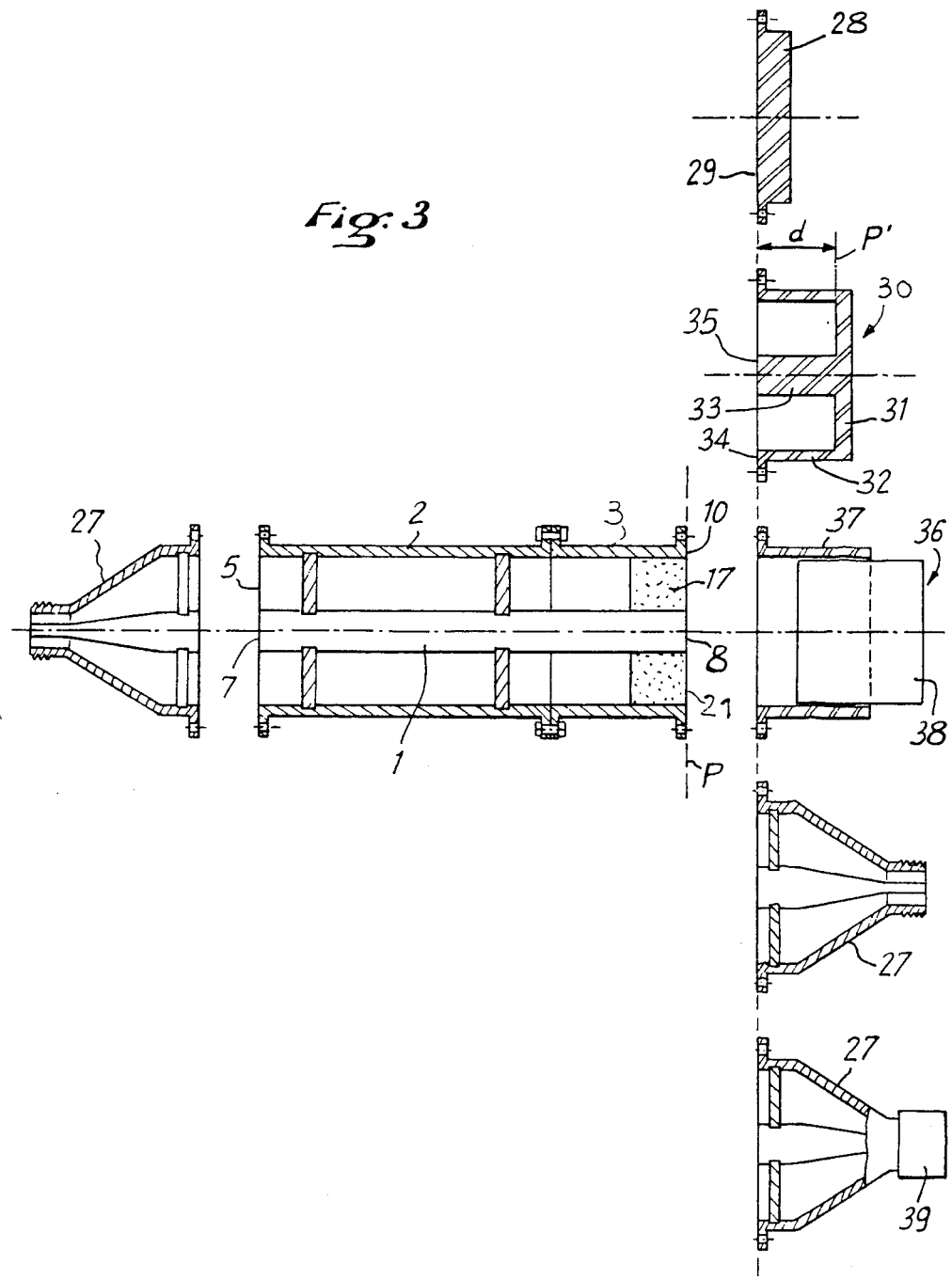
FIG. 3 is a schematic exploded view in section of the device of the invention with its calibrating and measuring accessories.

The device of the invention, illustrated schematically in FIG. 1, comprises a central core 1 and a tubular body made from two assemblable parts 2, 3. The central core 1 and tubular body 2,3 are made from electrically conducting materials and have circular sections. The central core 1 and the tubular body portion 2 are disposed coaxially with respect to each other and are held mechanically together by means of annular spacers 4 orthogonal to the longitudinal axis X—X common to said central core 1 and to said tubular body portion 2.

At its two ends, the tubular body portion 2 ends in flat annular end faces, respectively 5 and 6, orthogonal to the axis X—X. Similarly, the central core 1 is defined by two flat end faces orthogonal to axis X—X, referenced respectively 7 and 8. The flat end face 7 of core 1 is coplanar with the end face 5 of the tubular body portion 2, whereas, on the other hand, the flat end face 8 of core 1 projects with respect to the corresponding face 6 of the tubular body portion 2.

The tubular body portion 3 is defined by two annular flat end faces, respectively 9 and 10, orthogonal to its axis Y—Y. Vent holes 11 are provided in its sidewalls.

At their ends 5, 6, 9 and 10, the tubular body portions 2 and 3 are provided with means, respectively 12, 13, 14 and 15, shown schematically in the form of flanges for fixing them to other elements.

Portions 2 and 3 of the tubular body may be assembled rigidly together, using means 13 and 14, for example, associated with screws and nuts 16 (see figure 2). When portions 2 and 3 are thus firmly fixed together, the axes X—X and Y—Y are merged together and the end face 9 of the body portion 3 is applied against the end face 6 of the body portion 2. In addition, in this position of said body portions 2 and 3, the end face 8 of core 1 is in the plane of the end face 10 of body portion 3.

Thus it can be seen that the device of the invention formed of core 1 and body 2, 3 forms a rigid coaxial line which may be connected, on the end face 5 and 7 side, to a hyperfrequency generator.

In order to be able to examine the electromagnetic properties of a dielectric or magnetic material using the above described device 1-3, at least one piece 17, of annular shape, is machined from said material. The diameter of the central hole 18 in said annular piece 17 is such that it can be fitted on the central core 1 with a tight friction fit. Similarly, the diameter of the external periphery 19 of said annular piece 17 is such that it can be fitted in the body portion 3 also with a tight fit. Thus, when the body portions 2 and 3 are assembled together and when a piece 17 is introduced into the body portion 3 through the end face 10, this piece is in excellent electric contact both with core 1 and with body 2, 3.

Furthermore, piece 17 is defined by flat end faces 20 and 21 parallel to each other and orthogonal to the axis Z—Z of said piece.

In FIG. 2, a piece 17 has been shown during positioning in the body portion 3. This piece 17 is pushed by means of a tool 22 having a flat face 23 applied to face 21 of said piece. Tool 22 comprises at least one vent hole 24 for expelling the air imprisoned in hole 18 of piece 17, between the end face 8 of core 1 and said tool. It will be readily understood that air imprisoned inside body portion 3, between piece 17 and core 1, may escape through the vent holes 11 during introduction of said piece.

Tool 22 comprises means 25 able to cooperate with the means 15 of body portion 3 of fixing to the latter. When the tool is assembled on body portion 3, it is certain that axis Z—Z of piece 17 merges with the axes X—X and Y—Y and that the flat annular face 21 is coplanar with the end faces 8 and 10 of core 1 and of the body portion 3. Tool 22 is then removed if necessary, unless it serves as short circuit accessory in addition, as will be described hereafter.

In FIG. 3, piece 17 has been shown in position in device 1-3 and the plane common to faces 8, 10 and 21 has been designated by P.

It will be readily understood that, if an incident hyperfrequency wave is applied between end face 5 of body 2, 3 and the end face 7 of core 1, this wave will propagate through line 1-3 as far as piece 17. Consequently, this incident wave will pass through piece 17. When passing through piece 17, the electromagnetic wave has a propagation speed which, in a way known per se, is a function of the relative permittivity and of the relative permeability of the material forming piece 17. Since the thickness e of piece 17 is known, it is then sufficient to know the propagation time of the wave through said piece in order to obtain a relationship relating the relative permeability and permittivity of the material of piece 17. Now, this propagation time of the waves in the piece correpsonds to the phase-shift of the wave transmitted by said annular piece 17 with respect to the incident wave. In addition, the attenuation undergone by the electromagnetic wave on passing through piece 17 is also a function of the relative permeability and permittivity of the material of said piece. Thus, if several phase-shift and attenuation measurements are made with pieces made from the same material but of different thicknesses e, and/ or with different conditions for line 1-3, equations are obtained by means of which the relative permittivity and permeability of said material may be calculated.

In FIG. 3, in addition to the coaxial line 1-3, different accessories have been shown for connecting said line to an electromagnetic wave generator and a receiver and imposing on said coaxial line a known and reproducible electromagnetic condition.

It is a question essentially of :

coaxial connectors 27 for connecting the ends of said line 1-3 both to an incident electromagnetic wave generator and to a receiver receiving the electromagnetic wave transmitted by said piece 17. Such coaxial connectors 27 are preferably of the type described in the French patent application n° 88- 11010 filed on Aug. 3, 1987 by the Applicant and entitled "Dispositif pour le raccord de deux structurtes pour hyperfrequences, coaxiales et de diametres differents";

short-circuits 28 for providing an electromagnetic short circuit between core 1 and the tubular body 2-3 at the level of plane P. Such short circuits may be identical to accessory 22. They are essentially formed by a plate of electrically conducting material having a flat face 29 (or 23) able to be applied simultaneously to the end faces 10 and 8 of the body 2,3 of core 1, short circuits 30 providing an electromagnetic short circuit between core 1 and the tubular body 2-3 in a plane P', offset by a fixed distance d downstream of plane P. They are formed essentially by a piece of electrically conducting material having a plate 31, extended in the direction of line 1-3, by a coaxial casing 32 and core 33. Plate 31 is orthogonal to said casing and to said core and the latter have faces 34 and 35 which may be applied respectively agianst the face 10 of tubular body 2-3 and against face 8 of core 1, open circuits 36 formed of a casing 37 extending the tubular body 2,3 and an adjustable dielectric, magnetic or conducting core 38 sliding in said casing, calibrated loads, of known type, and for example of the order of 50 ohms able to be connected to line 1-3 thorough a coaxial connector 27.

Figure 4:
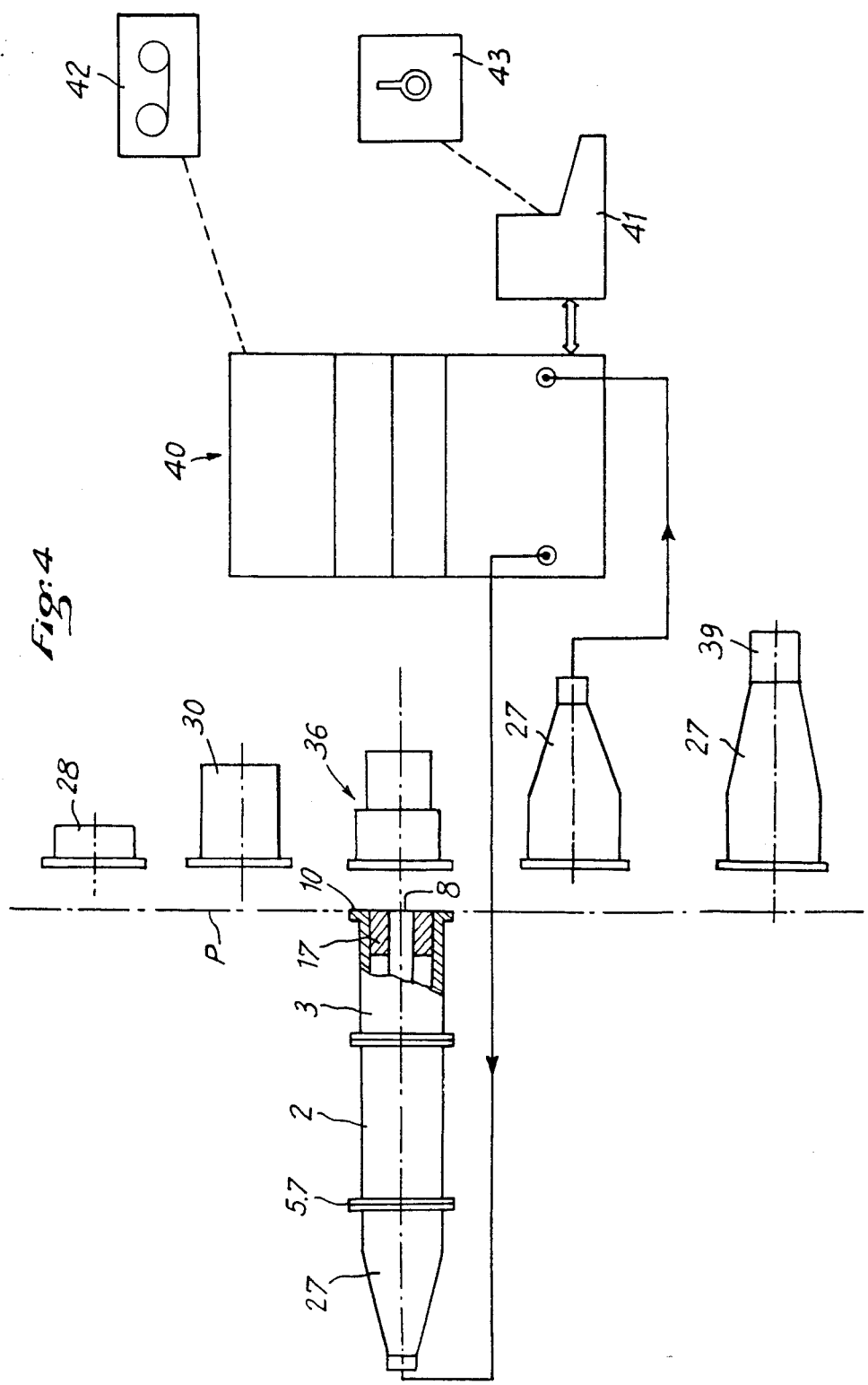
FIG. 4 illustrates the calibration and the measuring procedure of the device of the present invention.

As shown schematically in FIG. 4, this instrumentation 1-3, 27, 28, 30, 36 and 39 is completed by a network analysis and computation system, such for example as the one commercialized by HEWLETT PACKARD under the reference HP 8510, associated with a computer 41 (for example of type HP 9836). This unit receives data relative to the measurement system (FIG. 3) contained in memory 42 and a measurement programme and the mathematical processing 43.

It will be readily understood that the system shown in FIG. 4 may operate in different ways.

First of all it is possible by fixing a coaxial connector to each end of line 1-3 to operate with direct transmission, from one end of the line to the other. In this case, the incident wave is applied to end 5, 7 of line 1-3 and the transmitted wave is collected at the end 8,10 of this line. On the other hand, end 8, 10 of line 1-3 may be connected to one of the devices 28, 30, 36 or 39 so that in this case the electromagnetic wave is reflected and is collected at end 5, 7 at which the incident wave is applied. Similarly, the electromagnetic properties of two different materials may be compared directly by measuring the transmission coefficients or by measuring the reflection without measuring the relative permittivity and permeability, or else the system may be used for determining solely the attenuation produced by a given material.

However, in an advantageous embodiment of the system of FIG. 4 :

the off-load coaxial line 1-3, i.e. not having any annular piece 17, is first of all calibrated, this line working either under direct transmission (a coaxial connector 27 at each end), or by reflection (a coaxial connector 26 connected to end 5, 7 and a device 28, 30, 36 or 27, 39 connected to end 8, 10). This calibration operation makes it possible for system 40 to calculate the error coefficients required for precise measurement of the reflection and transmission coefficients of sample 17.

then, an annular piece 17 made from a dielectric or magnetic material is positioned and the coaxial line 1-3 is given a configuration identical to that of the preceding calibration. In addition, the same incident electromagnetic wave is then applied to the coaxial line 1-3 as during calibration. The system 40 then determines the reflection and/or transmission coefficients which result therefrom.

The system 40 determines the reflection and/or transmission coefficients proper to the annular piece 17 being examined, by using the error coefficients, measured during the calibration phase and calculated by system 40.

The above succession of operations is repeated several times, with different line configurations, so as to obtain sufficient measurements for calculating and confirming the real and imaginary values of the permeability and permittivity.

In FIG. 5, a practical embodiment has been shown of the rigid coaxial line 1-3. It can be seen that the spacers 4 are disposed at the ends of the body portion 2 and are engaged, by their inner and outer peripheries, in grooves 44 and 45 formed respectively in core 1 and in the tubular body 2, 3. For positioning these spacers, end pieces 46, 47 are provided fixed to said tubular body portion 2 and on which are fixed respectively a coaxial connector 27 and said tubular body portion 3. In addition, core 1 is made from several portions 1.1, 1.2 and 1.3 which can be assembled together and are provided with shoulders at their respective ends. The assembly of these different parts of core 1 may be obtained by any known means but, preferably, it is provided by means of the seal described in French patent n° 88 11011 filed on 3 August 1987 by the Applicant and entitled "Systeme de liaison a joint pour éléments travaillant en hyperfrequence". During a measuring procedure, said portions 1.1, 1.2 and 1.3 remain fixed together.

The annular piece 17 is housed in the tubular body portion 3 and is held in position by device 27, 28, 30 or 36 (bearing the common reference 50 in FIG. 5) which is fixed to the tubular body portion 3.

Guide and centering fingers 51 are provided between the different elements for facilitating assembly. Preferably, the different assemblies are formed by screwing.

It will be noted that it is important for core 1 and the tubular body 2, 3 to be fixed together by spacers 4. The latter make it possible to fix the relative positions of these elements and so to ensure repetitive positioning of said annular pieces 17 and further allow the tubular body 2, 3 to be given a large diameter. Thus, it is possible to use pieces 17 of large diameters, which is important for studying materials whose homogeneity is not microscopic. Of course, preliminary adjustments are made so that the spacers introduce a minimum of disturbance in the propagation of the electromagnetic waves. During these adjustments, material may be removed from or added to said spacers so that the parasite waves reflected by them have the minimum amplitude.

With the structure of the coaxial line 2, 3 of the present invention, it can be seen :

that the position of an annular piece is not altered when devices 27, 28, 30, 36, 50 are exchanged with each other;

that an annular piece 17 may be removed and replaced by another without changing the relative positions of core 1 and body 2, 3. In fact, after removal of part 3 for removing a piece 17 (portion 1.3 of core 1 remaining fixed to portion 1.2), this part 3 again takes up a position identical to the one it occupied before as soon as it is fixed again to part 2, and that all the successive pieces 17 occupy the same position inside the end of part 3 of the tubular body.

We claim:

1. Device for estimating the electromagnetic characteristics of a material, comprising:
    a rigid core (1) made from an electrically conducting material;
    a rigid tubular body (2, 3), also made from an electrically conducting material, surrounding said conducting core coaxially, so that said core and said tubular body are able to form a rigid coaxial line;
    means (27) for applying an incident hyperfrequency electromagnetic wave between said core and said body;
    a housing (48, 49) for an annular piece (17) of uniform thickness formed from said material, this annular piece being such that, when it is disposed in said housing, its external and internal peripheries are respectively in tight friction contact with the inner surface of said tubular body and with the outer surface of said core, and
    means (27) for collecting the electromagnetic wave transmitted by said annular piece, characterized:
    in that said tubular body (2, 3) is made from two parts which can be assembled together;
    in that said housing (48, 49) is provided at one end of said coaxial line; and
    in that a tool accessory having a flat thrust face is provided for positioning said annular piece (17) inside said coaxial line (2, 3), the final position of said annular piece being determined by abutment of said positioning means against said coaxial line.

2. Device according to claim 1, wherein said tool accessory constitutes a wave reflector element disposed downstream of said annular piece and provides a short circuit between the tubular body and the core of the coaxial line.

3. Device according to claim 1, wherein said wave reflector element is an electromagnetic element introducing a calibrated load (39) between the tubular body and the core of the coaxial line.

4. Device according to claim 1, wherein a plurality of different interchangeable reflector elements is provided.

5. Device according to claim 1 wherein said core and said tubualr body are joined together by internal annular spacers (4), and one of said spacers is located at the connection of the two assemblable parts of said tubular body.

6. Device according to claim 5 wherein at least one other spacer of the coaxial line is disposed in the end thereof opposite said connection of the two assemblable parts.

7. Device according to claim 6 wherein each spacer is held, at its internal and external peripheries, in facing grooves (44, 45) formed respectively in said core and in said tubular body.

8. Device according to claim 7 wherein each of said grooves is defined between a face of said tubular body and an end piece (46, 47) able to be assembled with said body and in that said core (1) is made of several parts (1.1 to 1.3) joined together.

9. Device according to claim 1 wherein said means for collecting the transmitted wave are disposed on the side of said coaxial line opposite the means for applying the incident wave.

10. Device according to claim 1 wherein said means for collecting the reflected wave are disposed on the same side of said coaxial line as the means for applying the incident wave and in that at least one wave reflector element (28, 30, 36, 39) is able to be disposed downstream of said annular piece.

* * * * *